US012353731B2

United States Patent
So

(10) Patent No.: US 12,353,731 B2
(45) Date of Patent: Jul. 8, 2025

(54) MEMORY CONTROLLER SEARCHING FOR DATA INPUT/OUTPUT VOLTAGE, MEMORY SYSTEM, AND OPERATING METHOD OF THE MEMORY SYSTEM

(71) Applicant: Samsung Electronics Co., Ltd., Suwon-si (KR)

(72) Inventor: Byungwook So, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 165 days.

(21) Appl. No.: 18/310,959

(22) Filed: May 2, 2023

(65) Prior Publication Data
US 2023/0384955 A1 Nov. 30, 2023

(30) Foreign Application Priority Data
May 27, 2022 (KR) .................. 10-2022-0065550

(51) Int. Cl.
*G06F 3/06* (2006.01)
*G11C 11/4074* (2006.01)
*G11C 5/14* (2006.01)
*G11C 11/4076* (2006.01)
*G11C 11/4093* (2006.01)

(52) U.S. Cl.
CPC .......... *G06F 3/0625* (2013.01); *G06F 3/0634* (2013.01); *G06F 3/0673* (2013.01); *G11C 11/4074* (2013.01); *G11C 5/147* (2013.01); *G11C 11/4076* (2013.01); *G11C 11/4093* (2013.01)

(58) Field of Classification Search
CPC .... G06F 3/0625; G06F 3/0634; G06F 3/0673; G06F 3/061; G06F 3/0653; G06F 3/0655; G06F 3/0679; G06F 3/0658; G11C 11/4074; G11C 5/147; G11C 11/4076; G11C 11/4093; G11C 11/54; G11C 29/021; G11C 29/028; G11C 7/1006; G11C 7/1045; G06N 3/08
USPC .................................................. 365/189.09
See application file for complete search history.

(56) References Cited

U.S. PATENT DOCUMENTS

| | | | |
|---|---|---|---|
| 8,681,571 B2 | 3/2014 | Fox et al. | |
| 8,902,684 B2 | 12/2014 | Kwean | |
| 9,767,868 B2 | 9/2017 | Srinivas et al. | |
| 9,910,484 B2 | 3/2018 | Muljono et al. | |
| 10,504,570 B2 | 12/2019 | Hotaruhara | |
| 11,003,370 B2 | 5/2021 | Kim et al. | |

(Continued)

*Primary Examiner* — Fernando Hidalgo
(74) *Attorney, Agent, or Firm* — Harness, Dickey & Pierce, P.L.C.

(57) ABSTRACT

Provided are a memory controller searching for a data input/output voltage, a memory system, and an operating method of the memory system. The operating method of the memory system configured to search for the data input/output voltage may include searching, by the memory system, for a first driving voltage lower than a first reference voltage by performing first training based on a booting voltage, searching, by the memory system, for a second driving voltage lower than a second reference voltage by performing second training based on the first driving voltage, and setting, by the memory system, the data input/output voltage lower than the first driving voltage, based on the second driving voltage.

20 Claims, 7 Drawing Sheets

(56) References Cited

U.S. PATENT DOCUMENTS 11,217,282 B2    1/2022   Kim
2020/0133542 A1*   4/2020   Kim ..................... G06F 3/0659

* cited by examiner

MEMORY CONTROLLER SEARCHING FOR DATA INPUT/OUTPUT VOLTAGE, MEMORY SYSTEM, AND OPERATING METHOD OF THE MEMORY SYSTEM

CROSS-REFERENCE TO RELATED APPLICATION

This application is based on and claims priority under 35 U.S.C. § 119 to Korean Patent Application No. 10-2022-0065550, filed on May 27, 2022, in the Korean Intellectual Property Office, the disclosure of which is incorporated by reference herein in its entirety.

BACKGROUND

Example embodiments relate to an electronic device, and more particularly, to a memory controller searching for a data input/output voltage, a memory system, and an operating method of the memory system.

A memory controller may perform a training operation on a memory device after power-on to meet the optimal alignment condition between data and clock signals, and may control a memory operation, such as a write operation and a read operation. However, a relatively high voltage is required (or alternatively, desired) for a memory controller to perform a training operation on a memory device, and thus, power consumption is large during the training operation.

SUMMARY

Example embodiments provide a memory device driven with an optimal low voltage by performing training at least twice to improve the performance of a memory system, a memory controller, a memory system including the memory controller, and an operating method of the memory system.

According to some example embodiments, there is provided an operating method of a memory system configured to search for a data input/output voltage, the operating method including searching, by the memory system, for a first driving voltage lower than a first reference voltage by performing first training based on a booting voltage, searching, by the memory system, for a second driving voltage lower than a second reference voltage by performing second training based on the first driving voltage, and setting, by the memory system, the data input/output voltage lower than the first driving voltage, based on the second driving voltage.

According to some other example embodiments, there is provided a memory controller configured to control a memory device, the memory controller including a first training circuit configured to transmit a first training command to the memory device through a plurality of signal pins, and receive a first driving voltage from the memory device, a first voltage comparison circuit configured to output the first driving voltage by comparing the first driving voltage with a first reference voltage, a set voltage generating circuit configured to generate a set voltage based on a value of a first guard band voltage and a value of the first driving voltage, a second training circuit configured to transmit a second training command to the memory device through the plurality of signal pins, and receive a second driving voltage from the memory device, a second voltage comparison circuit configured to output the second driving voltage by comparing the second driving voltage with a second reference voltage, and a data input/output voltage generating circuit configured to generate a data input/output voltage based on a value of a second guard band voltage and a value of the second driving voltage.

According to some other example embodiments, there is provided a memory system including a memory device, and a memory controller configured to output a data input/output voltage to be provided to the memory device, wherein the memory controller includes a training circuit configured to perform training on the memory device at least twice by receiving a booting voltage, a voltage comparison circuit configured to respectively compare driving voltages searched by the memory device with reference voltages, and a data input/output voltage generating circuit configured to generate the data input/output voltage based on a first voltage, the first voltage being based on a comparison result of the voltage comparison circuit, and wherein the memory device includes a mode register set (MRS) configured to store a result value obtained by performing the training.

BRIEF DESCRIPTION OF THE DRAWINGS

Example embodiments will be more clearly understood from the following detailed description taken in conjunction with the accompanying drawings in which.

DETAILED DESCRIPTION OF EXAMPLE EMBODIMENTS

Hereinafter, some example embodiments will be described in detail with reference to the accompanying drawings.

Figure 1:
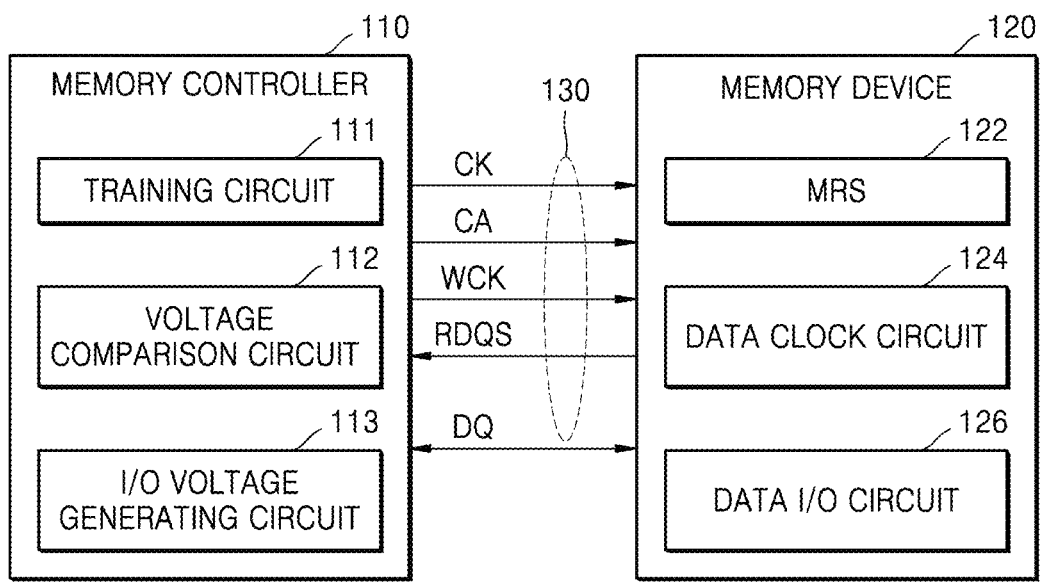
FIG. 1 is a block diagram of a memory system according to some example embodiments.

FIG. 1 is a block diagram of a memory system 100 according to some example embodiments.

Referring to FIG. 1, the memory system 100 may include a memory controller 110 and a memory device 120.

The memory controller 110 may be implemented to be included in a personal computer (PC) or a mobile electronic device. The mobile electronic device may be implemented as a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or a portable navigation device (PND), a handheld game console, a mobile Internet device (MID), a wearable computer, an Internet of Things (IoT) device, an Internet of Everything (IoE) device, or a drone.

The memory controller 110 may be implemented as an integrated circuit (IC), a system on a chip (SoC), an application processor (AP), a mobile AP, a chipset, or a set of chips. For example, the memory controller 110 may be a component included in an AP. The AP may include random access memory (RAM), a central processing unit (CPU), a graphics processing unit (GPU), and/or a modem.

The memory device 120 may be implemented as a volatile memory device. The volatile memory device may be implemented as RAM, dynamic RAM (DRAM), or static RAM (SRAM), but is not limited thereto. For example, the memory device 120 may correspond to double data rate synchronous dynamic random access memory (DDR SDRAM), low power double data rate (LPDDR) SDRAM, graphics double data rate (GDDR) SDRAM, Rambus dynamic random access memory (RDRAM), etc. Alternatively, the memory device 120 may be implemented as a high bandwidth memory (HBM).

In FIG. 1, the memory device 120 is illustrated as a single semiconductor chip, but n (wherein n is a non-zero whole number) memory devices may be included actually.

The memory device 120 may be coupled to buses 130 including a command/address bus, a data bus, and a clock bus. The memory controller 110 and the memory device 120 may communicate with each other through various buses. For example, commands and addresses CA may be received by the memory device 120 through the command/address bus, and data DQ may be provided between the memory controller 110 and the memory device 120 through the data bus 130. Various clock signals may be provided between the memory controller 110 and the memory device 120 through the clock bus 130. The clock bus 130 may include a system clock CK received by the memory device 120, a data clock WCK received by the memory device 120, and signal lines for providing the memory controller 110 with a read clock RDQS provided by the memory device 120. Each of (or alternatively, at least one of) buses 130 may include at least one signal line to which signals are provided.

The clock CK provided to the memory device 120 by the memory controller 110 may be used for timing of provision and reception of commands and addresses. The data clock WCK and the read clock RDQS may be used for timing of data provision.

The data clock WCK provided to the memory device 120 by the memory controller 110 may also be synchronized with the clock CK provided to the memory device 120 by the memory controller 110.

The memory controller 110 may provide a command to the memory device 120 to perform a memory operation. Non-limiting examples of a memory command may include a timing command for controlling the timings of various operations, an access command for accessing a memory, such as a read command for performing a read operation and a write command for performing a write operation, mode register write and read commands for performing mode register write and read operations, and other commands and operations.

To accurately perform a memory operation according to these operation timings, the memory controller 110 may include a training circuit 111 for performing memory training on the memory device 120, a voltage comparison circuit 112, and an input/output voltage (I/O) generating circuit 113.

The training circuit 111 may perform memory core parameter training associated with a memory core and/or peripheral circuit parameter training for peripheral circuits other than a memory core in the memory device 120, in response to a training command. The training circuit 111 may become a training subject and determine an optimal parameter for a memory core parameter and/or a peripheral circuit parameter. In some example embodiments, although the training circuit 111 is described as being included in the memory controller 110, the training circuit 111 may be included in the memory device 120. When the training circuit 111 is included in the memory device 120, the memory device 120 may also become a training subject and perform memory training. Training may be performed based on a booting voltage. The booting voltage may be a voltage that a memory device requires to perform training. Alternatively, the booting voltage may be a voltage applied by the memory controller 110 to the memory device 120.

The voltage comparison circuit 112 may compare a driving voltage with a reference voltage. The voltage comparison circuit 112 may compare driving voltages searched by the memory device 120 with reference voltages of the memory controller 110, respectively. A driving voltage may be a voltage required (or alternatively, desired) for operating the memory device 120. A reference voltage may be a reference voltage for obtaining an optimal driving voltage (or a lowest driving voltage). The driving voltages searched by the memory device 120 may include a first driving voltage and a second driving voltage. For example, the first driving voltage may be a voltage searched as a result in which the memory device 120 performs a first training operation, and the second driving voltage may be a voltage searched as a result in which the memory device 120 performs a second training operation. A value of the second driving voltage may be less than a value of the first driving voltage. Reference voltages of the memory controller 110 may include a first reference voltage and a second reference voltage. A value of the first reference voltage may be less than a value of the second reference voltage.

The voltage comparison circuit 112 may compare the first driving voltage with the first reference voltage, and may compare the second driving voltage with the second reference voltage. For example, the voltage comparison circuit 112 may compare a value of the first driving voltage with a value of the first reference voltage, and output the first driving voltage when the value of the first driving voltage is less than the value of the first reference voltage. On the contrary, when the value of the first driving voltage is greater than the value of the first reference voltage, the voltage comparison circuit 112 may output the first driving voltage or increase the first reference voltage. For example, the voltage comparison circuit 112 may compare a value of the second driving voltage with a value of the second reference voltage, and output the second driving voltage when the value of the second driving voltage is less than the value of the second reference voltage. On the contrary, when the value of the second driving voltage is greater than the value of the second reference voltage, the voltage comparison circuit 112 may output the second driving voltage or increase the second reference voltage. That is, the voltage comparison circuit 112 may compare the driving voltage value with the reference voltage value and output a voltage according to the comparison result.

The I/O voltage generating circuit 113 may generate a data I/O voltage (IOV), based on the voltage output from the voltage comparison circuit 112. The I/O voltage generating circuit 113 may generate a set voltage, based on the voltage output from the voltage comparison circuit 112. For example, when the value of the first driving voltage compared by the voltage comparison circuit 112 is less than a value of the first reference voltage, the I/O voltage generating circuit 113 may add a value of a first guard band voltage to the value of the first driving voltage to obtain a set voltage. When the value of the second driving voltage compared by the voltage comparison circuit 112 is less than the value of the second reference voltage, the I/O voltage generating circuit 113 may set an adaptive supply voltage (ASV). The I/O voltage generating circuit 113 may generate a data IOV by adding the value of a second guard band voltage to the value of the second driving voltage.

The memory device 120 may include a mode register (MRS) 122, a data clock circuit 124, and a data I/O circuit 126.

The MRS 122 may store information used to configure an operation of the memory device 120 to set an operating condition for the memory device 120. The MRS 122 may store information about the data clock WCK and the read clock RDQS.

The data clock circuit 124 may perform duty monitoring of the data clock WCK. The data clock circuit 124 may provide a duty cycle result for the data clock WCK to the memory controller 110. The data clock circuit 124 may perform duty monitoring of the read clock RDQS. The data clock circuit 124 may provide a duty cycle result for the read clock RDQS to the memory controller 110.

The data I/O circuit 126 may transmit read data DQ synchronized with the read clock RDQS to the memory controller 110, and receive write data DQ synchronized with the data clock WCK from the memory controller 110.

Figure 2:
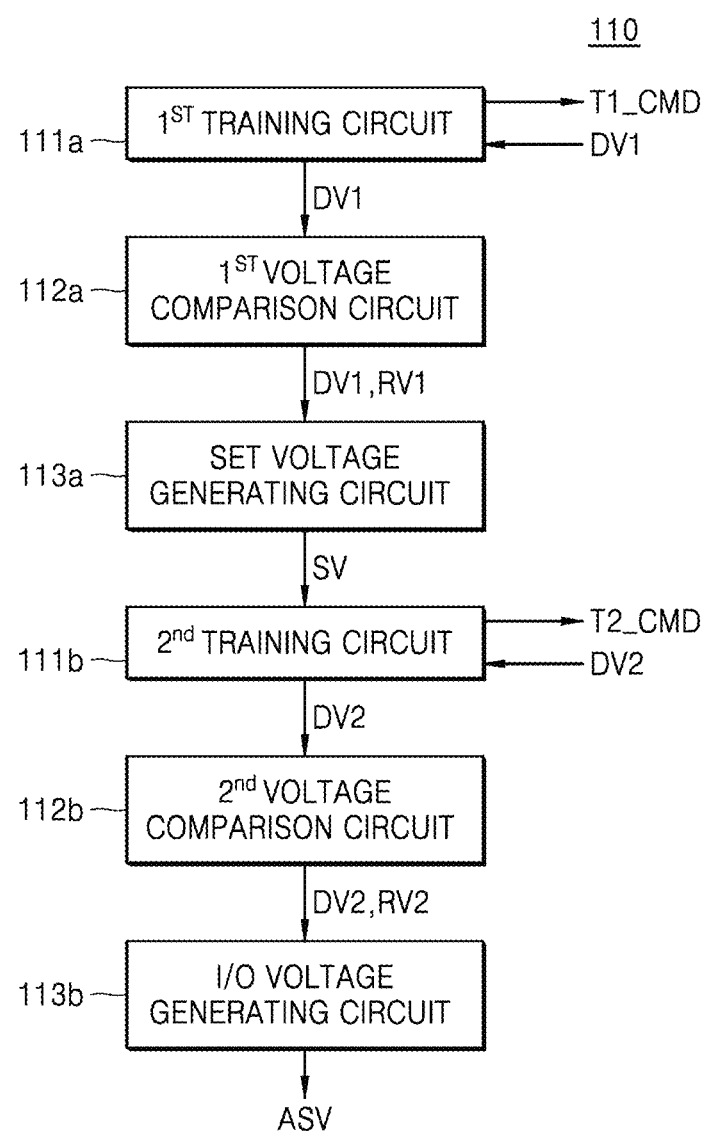
FIG. 2 is a block diagram of the structure of the memory controller of FIG. 1.

FIG. 2 is a block diagram of the structure of the memory controller 110 of FIG. 1.

Referring to FIG. 2, the memory controller 110 may include a first training circuit 111a, a first voltage comparison circuit 112a, a set voltage generating circuit 113a, a second training circuit 111b, a second voltage comparison circuit 112b, and an I/O voltage generating circuit 113b.

The first training circuit 111a and the second training circuit 111b shown in FIG. 2 may be included in the training circuit 111 of FIG. 1, the first voltage comparison circuit 112a and the second voltage comparison circuit 112b may be included in the voltage comparison circuit 112 of FIG. 1, and the set voltage generating circuit 113a and the I/O voltage generating circuit 113b may be included in the I/O voltage generating circuit 113 of FIG. 1.

The first voltage comparison circuit 112a, the second voltage comparison circuit 112b, and the set voltage generation circuit 113a may be implemented in various forms, and according to an embodiment, the first voltage comparison circuit 112a, the second the voltage comparison circuit 112b and the set voltage generation circuit 113a may be implemented in hardware or software. The first voltage comparison circuit 112a, the second voltage comparison circuit 112b, and the set voltage generation circuit 113a may be implemented in a form of a combination of software and hardware, such as firmware.

The first training circuit 111a may generate a first training command T1_CMD. The first training circuit 111a may provide the generated first training command T1_CMD to the memory device 120 to train the memory device 120. First training may mean that an improved (or alternatively, optimized) data IOV or the like of the memory device 120 may be searched for or adjusted by the first training command T1_CMD, and operations of adjusting, changing, or correcting code under the control of a command are sequentially and repeatedly performed. The first training circuit 111a may receive a first driving voltage DV1 searched by the memory device 120.

The first voltage comparison circuit 112a may compare the first driving voltage DV1 with a first reference voltage RV1. The first voltage comparison circuit 112a may receive the first driving voltage DV1 output from the first training circuit 111a, and the first reference voltage RV1 may be stored in the first voltage comparison circuit 112a. The first voltage comparison circuit 112a may output a result of comparing the first driving voltage DV1 with the first reference voltage RV1. For example, when a value of the first driving voltage DV1 is less than a value of the first reference voltage RV1, the first voltage comparison circuit 112a may output the first driving voltage DV1. For example, when the value of the first driving voltage DV1 is greater than the value of the first reference voltage RV1, the first voltage comparison circuit 112a may output the first driving voltage DV1. The first voltage comparison circuit 112a may output a voltage having a low voltage value by comparing the value of the first driving voltage DV1 with the value of the first reference voltage RV1.

The set voltage generating circuit 113a may receive the first driving voltage DV1 or the first reference voltage RV1 output by the first voltage comparison circuit 112a. The set voltage generating circuit 113a may generate a set voltage SV by receiving the first driving voltage DV1. In particular, for example, the set voltage generating circuit 113a may receive the first driving voltage DV1 from the first voltage comparison circuit 112a. The set voltage generating circuit 113a may generate the set voltage SV by adding a value of a first guard band voltage GBV1 to a value of the first driving voltage DV1. The value of the first driving voltage DV1 may be greater than the value of the first guard band voltage GBV1. The reason for setting the set voltage SV by adding the value of the first guard band voltage GBV1 to the value of the first driving voltage DV1 is to ensure a turn-on state of the memory device 120 when the memory device 120 operates. In particular, when the memory controller 110 operates the memory device 120 by using only the first driving voltage DV1, even when the size of the first driving voltage DV1 swings slightly due to internal and external influences, the memory device 120 may be turned off. Accordingly, the first guard band voltage GB may be required (or alternatively, desired) as an offset voltage to ensure the turn-on state of the memory device 120.

The second training circuit 111b may generate a second training command T2_CMD. The second training circuit 111b may provide the generated second training command T2_CMD to the memory device 120 to train the memory device 120. Second training may mean that an improved (or alternatively, optimized) data IOV or the like of the memory device 120 may be searched for or adjusted by the second training command T2_CMD, and operations of adjusting, changing, or correcting code under the control of a command are sequentially and repeatedly performed. The second training circuit 111b may receive a second driving voltage DV2 that is a result of performing second training.

The second voltage comparison circuit 112b may compare the second driving voltage DV2 with a second reference voltage RV2. The second voltage comparison circuit 112b may receive the second driving voltage DV2 from the second training circuit 111b, and the second reference voltage RV2 may be stored in the second voltage comparison circuit 112b. The second voltage comparison circuit 112b may output a result of comparing the second driving voltage DV2 with the second reference voltage RV2. For example, when the second driving voltage DV2 is less than the second reference voltage RV2, the second voltage comparison circuit 112b may output the second driving voltage DV2.

The I/O voltage generating circuit 113b may generate an ASV by receiving the second driving voltage DV2. In particular, for example, the I/O voltage generating circuit 113b may receive the second driving voltage DV2 from the second voltage comparison circuit 112b. The I/O voltage generating circuit 113b may generate a data IOV by adding a value of a second guard band voltage GBV2 to a value of the second driving voltage DV2. The value of the second driving voltage DV2 may be greater than the value of the second guard band voltage GBV2. Also, the value of the second guard band voltage GBV2 may be equal to or different from the value of the first guard band voltage GBV1. The reason why the second guard band voltage GBV2 is required (or alternatively, desired) to ensure the turn-on state of the memory device 120 when the memory device 120 operates, which is same as the reason why the first guard band voltage GBV1 is required (or alternatively, desired). A value of the data IOV may be less than a value of a booting voltage.

Figure 3:
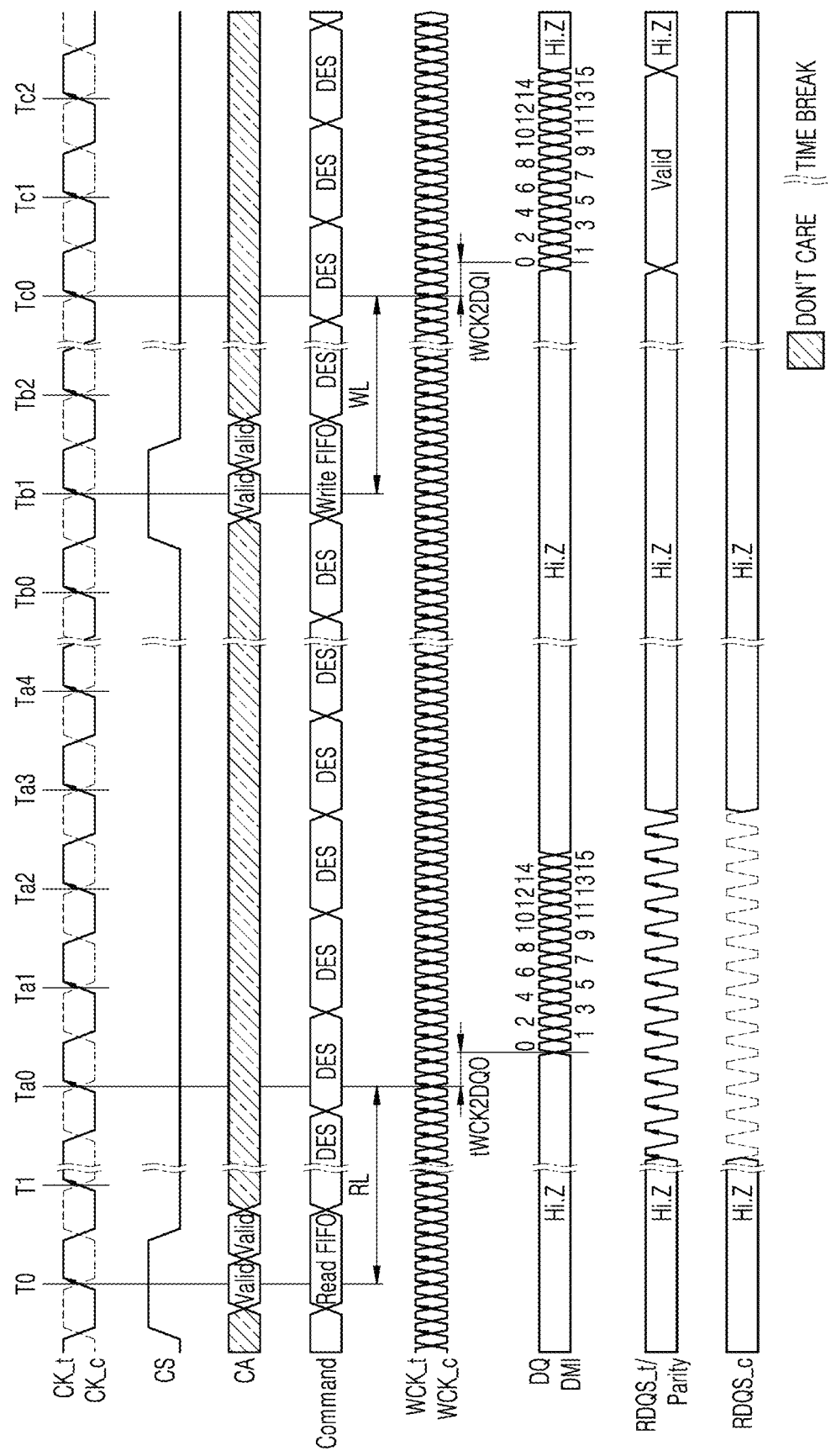
FIG. 3 is a timing diagram of signals moving between a memory device and a memory controller during training, according to some example embodiments.

FIG. 3 is a timing diagram of signals moving between a memory device and a memory controller during training, according to some example embodiments.

Referring to FIG. 3, the memory device 120 may be started as a command (Read FIFO or Write FIFO) is transmitted from the memory controller 110. A Read FIFO command may be received before time T0. A Write FIFO command may be received before time Tb1. Read data DQ may be toggled 16 times between time Ta00 and time Ta3. Write data DQ may be toggled 16 times after time Tc0. tWCK2DQO may mean a time during which data is output in response to a data clock. tWCK2DQI may mean time during which data is input in response to the data clock.

The memory controller 110 may provide clocks CK_t and CK_c, data clocks WCK_t and WCK_c, and read clocks RDQS_t and RDQS_c to the memory device 120. The clocks CK_t and CK_c may be used for timing the provision and reception of commands and addresses CA. The data clocks WCK_t and WCK_c and the read clocks RDQS_t and RDQS_c may be used for timing of data provision. The clocks CK_t and CK_c are complementary, the data clocks WCK_t and WCK_c are complementary, and the read clocks RDQS_t and RDQS_c are complementary. Also, the data clocks WCK_t and WCK_c may have higher clock frequencies than clock frequencies of the clocks CK_t and CK_c. For example, the data clocks WCK_t and WCK_c may each have a clock frequency that is four times the clock frequency of each of (or alternatively, at least one of) the clocks CK_t and CK_c. Hereinafter, for convenience of description, the clocks CK_t and CK_c may be referred to as CK clocks, the data clocks WCK_t and WCK_c may be referred to as WCK clocks, and the read clocks RDQS_t and RDQS_c may be referred to RDQS clocks.

Referring FIGS. 1 and 3 together, when the memory controller 110 provides a read command and a related address to the memory device 120, the memory device 120 may receive the read command and the related address. The memory device 120 may output data DQ by performing a read operation. The memory device 120 may provide the output data DQ to the memory controller 110. At this time, the data DQ provided to the memory controller 110 may be referred to as read data. For example, when the data DQ is provided from the memory device 120 to the memory controller 110, the data DQ may be based on a read latency (RL) value indicating the number of clock cycles of the clocks CK_t and CK_c after a read command. The RL value is programmed by the memory controller 110. For example, the RL value may be programmed into the MRS 122 of the memory device 120. The MRS 122 included in the memory device 120 may be programmed with information for setting various operation modes and/or for selecting a feature for a memory operation. One of the settings may be for the RL value. Although the MRS 122 is illustrated as being included in the memory device 120 in FIG. 1, it is not limited thereto and may be included in the memory controller 110.

Referring to FIGS. 1 and 3 together, the memory controller 110 may provide the data clock WCK to the memory device 120 such that the memory controller 110 receives the data DQ from the memory device 120. The data clock WCK may be used to generate the read clock RDQS. A clock signal CS is activated when the clock signal CS is periodically transitioned between a low clock level and a high clock level. On the contrary, when the clock signal maintains a constant clock level and does not transition periodically, the clock signal CS is inactive. The memory controller 110 may provide the read clock RDQS to the memory device 120 such that the memory controller 110 receives the data DQ from the memory device 120.

Referring to FIGS. 1 and 3, when the memory controller 110 provides a write command and a related address to the memory device 120, the memory device 120 may receive the write command and the related address. The memory device 120 may input the data DQ by performing a write operation. The memory device 120 may receive the data DQ from the memory controller 110. At this time, the data DQ received by the memory device 120 may be referred to as write data. For example, when the data DQ is provided from the memory controller 110 to the memory device 120, the data DQ may be based on a write latency (WL) value indicating the number of clock cycles of the clocks CK_t and CK_c after a write command. The WL value may be programmed by the memory controller 110. For example, the WL value may be programmed into the MRS 122 of the memory device 120. The MRS 122 included in the memory device 120 may be programmed with information for setting various operation modes and/or for selecting a feature for a memory operation. One of the settings may be for the WL value.

As the memory controller 110 transmits a command to the memory device 120, a training operation may be performed on the memory device 120. As a result of performing the training operation, a re-training operation may be performed on the memory device 120 to align data and a clock signal with a low voltage by comparing a driving voltage with a reference voltage. To perform the re-training operation, the memory controller 110 may compare the driving voltage with the reference voltage to determine a re-training voltage based on a comparison result, and control the re-training operation on the memory device 120.

Figure 4:
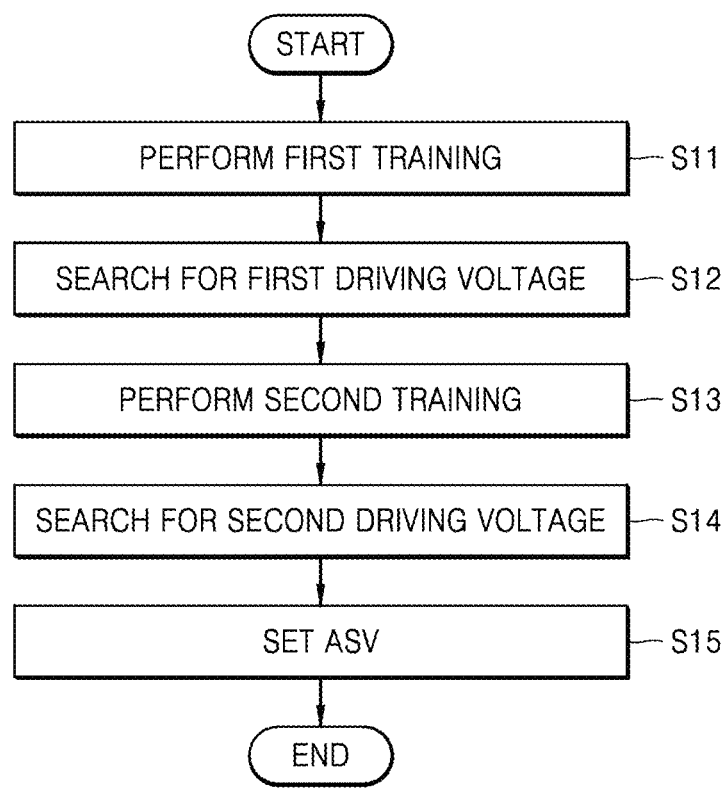
FIG. 4 is a flowchart illustrating an operating method of a memory system according to some example embodiments.

FIG. 4 is a flowchart illustrating an operating method of a memory system according to some example embodiments. As shown in FIG. 4, an operating method of a memory system may include operations S11 to S15.

In operation S11, a memory device may perform first training. For example, the first training circuit 111a may generate the first training command T1_CMD and provide the generated first training command T1_CMD to the memory device 120, and thus, the memory device 120 may perform the first training.

In operation S12, the memory device may search for a first driving voltage. For example, the memory device 120 may search for the first driving voltage DV1 that is a result of performing the first training. The first driving voltage DV1 may mean a low or minimum voltage desired for driving the memory device 120 when data is output. The memory device 120 may provide the searched first driving voltage DV1 to the memory controller 110.

In operation S13, the memory device may perform second training. For example, the second training circuit 111b may generate the second training command T2_CMD and provide the generated second training command T2_CMD to the memory device 120, and thus, the memory device 120 may perform the second training.

In operation S14, the memory device may search for a second driving voltage. For example, the memory device 120 may search for the second driving voltage DV2 that is a result of performing the second training. The second driving voltage DV2 may mean a low or minimum voltage desired for driving the memory device 120 when data is input. The memory device 120 may transmit the searched second driving voltage DV2 to the memory controller 110.

In operation S15, the memory controller may set an ASV. For example, the I/O voltage generating circuit 113b may set the ASV. Thereafter, the data IOV may be generated based on the ASV. Setting the data IOV may include adding the value of the second guard band voltage GBV2 to the value of the second driving voltage DV2. The sum of the value of the second driving voltage DV2 and the value of the second guard band voltage GBV2 may be set as the value of the data IOV.

According to some example embodiments, power consumed in a memory system may be reduced by setting an improved (or alternatively, optimized) ASV to a lower voltage by a re-training operation.

In addition, according to some example embodiments, the performance of the memory system may be improved by searching for an improved (or alternatively, optimized) low voltage by performing training two or more times.

Figure 5:
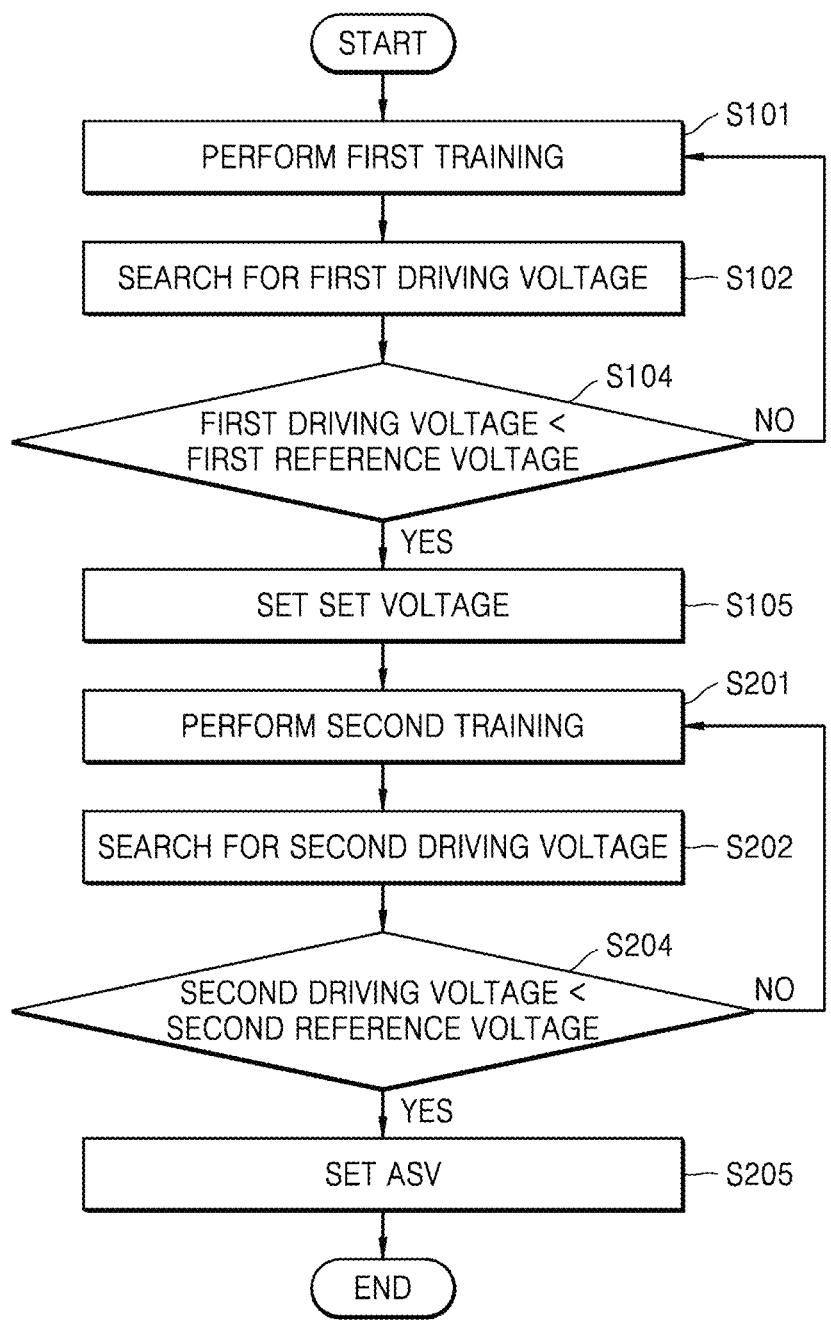
FIG. 5 is a flowchart illustrating the operating method of a memory system of FIG. 4, according to some example embodiments.

FIG. 5 is a flowchart illustrating the operating method of a memory system of FIG. 4, according to some example embodiments. FIG. 5 illustrates the operating method of a memory system of FIG. 4 in detail.

Referring to FIG. 5, in operation S101, the memory device may perform first training. For example, the first training circuit 111a may generate the first training command T1_CMD and provide the generated first training command T1_CMD to the memory device 120, and thus, the memory device 120 may perform the first training.

In operation S102, the memory device may search for a first driving voltage. For example, the memory device 120 may search for the first driving voltage DV1 that is a result of performing the first training. The first driving voltage DV1 may mean a low or minimum voltage desired for driving the memory device 120 when the data DQ is output. The memory device 120 may provide the searched first driving voltage DV1 to the memory controller 110.

In operation S104, the memory controller may compare the first driving voltage with a first reference voltage. When the value of the first driving voltage DV1 is less than the value of the first reference voltage RV1 (YES), the set voltage SV may be set. When the value of the first driving voltage DV1 is greater than the value of the first reference voltage RV1 (NO), operation S101 may be returned again.

In operation S105, the memory controller may set the set voltage SV. Setting the set voltage SV may further include adding the value of the first guard band voltage GBV1 to the value of the first driving voltage DV1. The value of the set voltage SV may be a value obtained by adding the value of the first guard band voltage GB to the value of the first driving voltage DV1. The value of the set voltage SV may be greater than the value of the first driving voltage DV1. The value of the first driving voltage DV1 may be greater than the value of the first guard band voltage GBV1.

According to some example embodiments, after the first training operation, the memory device 120 may search for the first driving voltage DV1 and set the set voltage SV based on the searched first driving voltage DV1 to perform a second training (re-training) operation on the memory device 120, thereby setting an ASV to improve the performance of the memory system through voltage improvement (or alternatively, optimization).

In operation S201, the memory device may perform second training. For example, the second training circuit 111b may generate the second training command T2_CMD and provide the generated second training command T2_CMD to the memory device 120, and thus, the memory device 120 may perform the second training.

In operation S202, the memory device may search for a second driving voltage. For example, the memory device 120 may search for the second driving voltage DV2 that is a result of performing the second training. The searching for the second driving voltage DV2 may include performing the second training with the set voltage SV. The second driving voltage DV2 may mean a low or minimum voltage desired for driving the memory device 120 when data is input. The memory device 120 may transmit the searched second driving voltage DV2 to the memory controller 110.

In operation S204, the memory controller may compare the second driving voltage with a second reference voltage. When the value of the second driving voltage DV2 is less than the value of the second reference voltage RV2 (YES), the ASV may be set. When the value of the second driving voltage DV2 is greater than the value of the second reference voltage RV2 (NO), operation S201 may be returned again. The value of the second reference voltage RV2 may be different from the value of the first reference voltage RV1. For example, the value of the second reference voltage RV2 may be greater than the value of the first reference voltage RV1, and the value of the first reference voltage RV1 may be less than the value of the second reference voltage RV2.

In operation S205, the memory controller may set an ASV. A data IOV may be set based on the ASV. Setting the data IOV may include adding the value of the second guard band voltage GBV2 to the value of the second driving voltage DV2. The value of the data IOV may be a value obtained by adding the value of the second guard band voltage GBV2 to the value of the second driving voltage DV2. The value of the data IOV may be greater than the value of the second driving voltage DV2. The value of the second driving voltage DV2 may be less than the value of the first driving voltage DV1. The value of the second driving voltage DV2 may be greater than the value of the second guard band voltage GBV2. The value of the second guard band voltage GBV2 may be equal to the value of the first guard band voltage GBV1, or may be different from the value of the first guard band voltage GBV1.

According to some example embodiments, power consumed in a memory system may be reduced by setting an improved (or alternatively, optimized) ASV to a lower voltage by a re-training operation.

Figure 6:
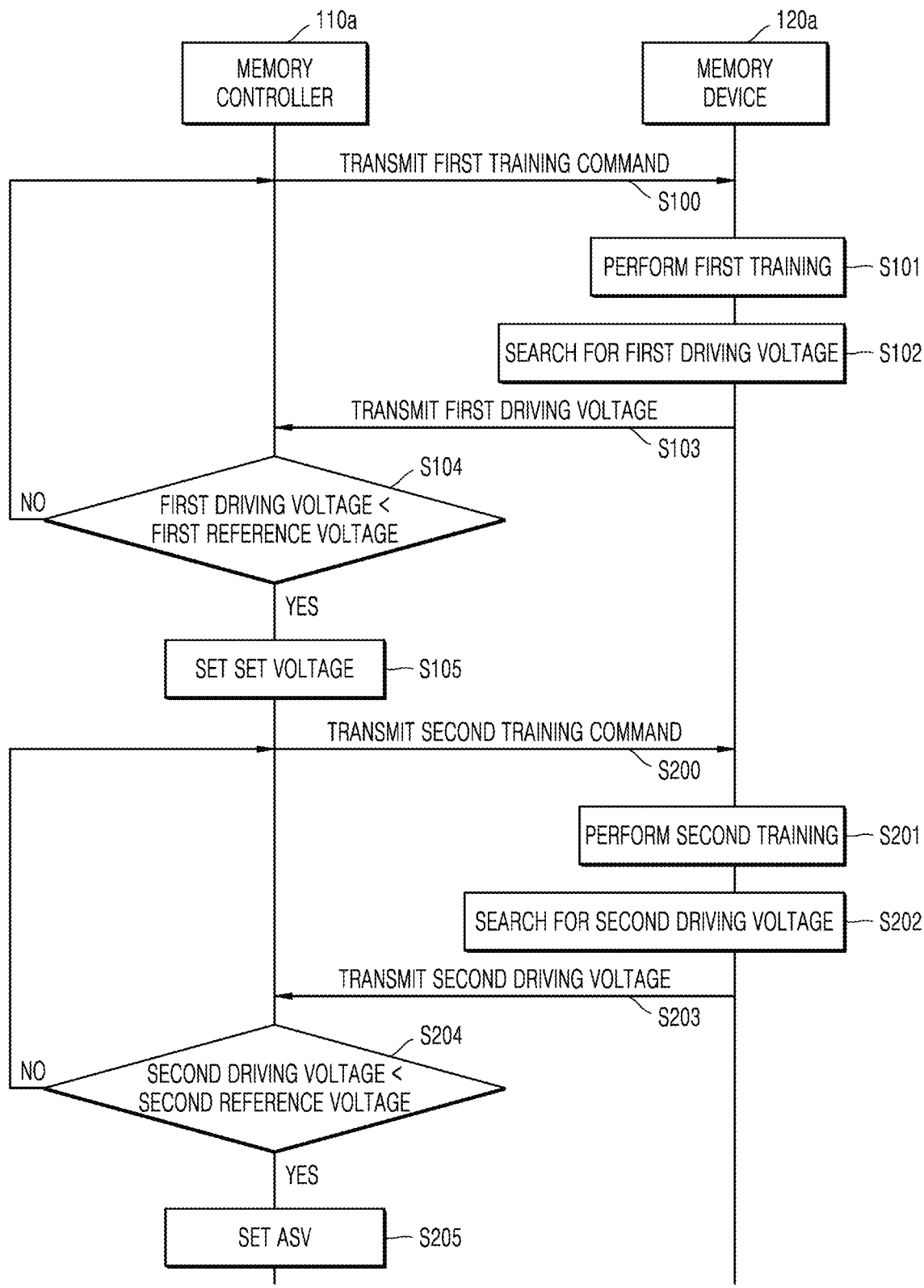
FIG. 6 is a diagram illustrating examples of operations between a memory controller and a memory device over time, according to some example embodiments.

In addition, according to some example embodiments, the performance of the memory system may be improved by searching for an improved (or alternatively, optimized) low voltage by performing training two or more times. FIG. 6 is a diagram illustrating examples of operations between a memory controller and a memory device over time, according to some example embodiments.

Referring to FIG. 6, a memory controller 110a and a memory device 120a may respectively correspond to the memory controller 110 and the memory device 120 shown in FIG. 1.

In operation S100, the memory controller 110a may transmit a first training command. For example, the first training circuit 111a of the memory controller 110 may transmit the first training command T1_CMD to the memory device 120.

In operation S101, the memory device 120a may perform first training in response to the received first training command. The first training may mean that an improved (or alternatively, optimized) data I/O voltage or the like of the memory device 120a may be searched for or adjusted by the first training command T1_CMD, and operations of adjusting, changing, or correcting code under the control of a command are sequentially and repeatedly performed.

Next, in operation S102, the memory device 120a may search for a first driving voltage based on a result of performing the first training. The first driving voltage DV1 may mean a low or minimum voltage desired for driving the memory device 120a when data is output. In operation S103, the memory device 120a may transmit the searched first driving voltage to the memory controller 110a.

In operation S104, the memory controller 110a may compare the first driving voltage received from the memory device 120a with a first reference voltage stored in the memory controller 110a. For example, the first voltage comparison circuit 112a may receive the first driving voltage DV1 from the first training circuit 111a, and the first reference voltage RV1 may be stored in the first voltage comparison circuit 112a. The first voltage comparison circuit 112a may output a result of comparing the first driving voltage DV1 with the first reference voltage RV1. When the first driving voltage DV1 is less than the first reference voltage RV1 (YES), the first voltage comparison circuit 112a may output the first driving voltage DV1. On the contrary, when the value of the first driving voltage DV1 is greater than the value of the first reference voltage RV1 (NO), operation S100 may be returned again.

In operation S105, the memory controller 110a may generate a set voltage. For example, the set voltage generating circuit 113a may generate the set voltage SV by receiving the first driving voltage DV1. The set voltage generating circuit 113a may generate the set voltage SV by adding a value of the first guard band voltage GBV1 to a value of the received first driving voltage DV1. In other words, setting the set voltage SV may further include adding the value of the first guard band voltage GBV1 to the value of the first driving voltage DV1. The value of the set voltage SV may be a value obtained by adding the value of the first guard band voltage GBV1 to the value of the first driving voltage DV1. The value of the set voltage SV may be greater than the value of the first driving voltage DV1. The value of the first driving voltage DV1 may be greater than the value of the first guard band voltage GBV1.

In operation S201, the memory controller 110a may transmit a second training command. For example, the second training circuit 111b of the memory controller 110 may transmit the second training command T2_CMD to the memory device 120.

In operation S201, the memory device 120a may perform second training in response to the received second training command. The second training may mean that an improved (or alternatively, optimized) data I/O voltage or the like of the memory device 120a may be searched for or adjusted by the second training command T2_CMD, and operations of adjusting, changing, or correcting code under the control of a command are sequentially and repeatedly performed.

Next, in operation S202, the memory device 120a may search for a second driving voltage based on a result of performing the second training. The second driving voltage DV2 may mean a low or minimum voltage desired for driving the memory device 120a when data is input. In operation S203, the memory device 120a may transmit the searched second driving voltage to the memory controller 110a.

In operation S204, the memory controller 110a may compare the second driving voltage received from the memory device 120a with a second reference voltage stored in the memory controller 110a. For example, the second voltage comparison circuit 112b may receive the second driving voltage DV2 from the second training circuit 111b, and the second reference voltage RV2 may be stored in the second voltage comparison circuit 112b. The second voltage comparison circuit 112b may output a result of comparing the second driving voltage DV2 with the second reference voltage RV2. The second voltage comparison circuit 112b may output a result of comparing the second driving voltage DV2 with the second reference voltage RV2. When the value of the second driving voltage DV2 is less than the value of the second reference voltage RV2 (YES), the second voltage comparison circuit 112b may output the second driving voltage DV2. On the contrary, when the value of the second driving voltage DV2 is greater than the value of the second reference voltage RV2 (NO), operation S200 may be returned again.

The memory controller 110a may set an ASV. A data IOV may be set based on the ASV. Setting the data IOV may include adding the value of the second guard band voltage GBV2 to the value of the second driving voltage DV2. The value of the data IOV may be a value obtained by adding the value of the second guard band voltage GBV2 to the value of the second driving voltage DV2. The value of the data IOV may be greater than the value of the second driving voltage DV2. The value of the second driving voltage DV2 may be less than the value of the first driving voltage DV1. The value of the second driving voltage DV2 may be greater than the value of the second guard band voltage GBV2. A value of a booting value may be greater than the value of the data IOV. That is, the value of the data IOV may be less than the value of the booting value.

According to some example embodiments, as the ASV is set, the memory controller 110 may control the memory device 120 by applying a low (e.g., lower than a previous voltage) voltage as the data IOV and perform input/output operations with the low voltage as the data IOV, thereby reducing power consumption of a memory system while inputting and outputting data.

Figure 7:
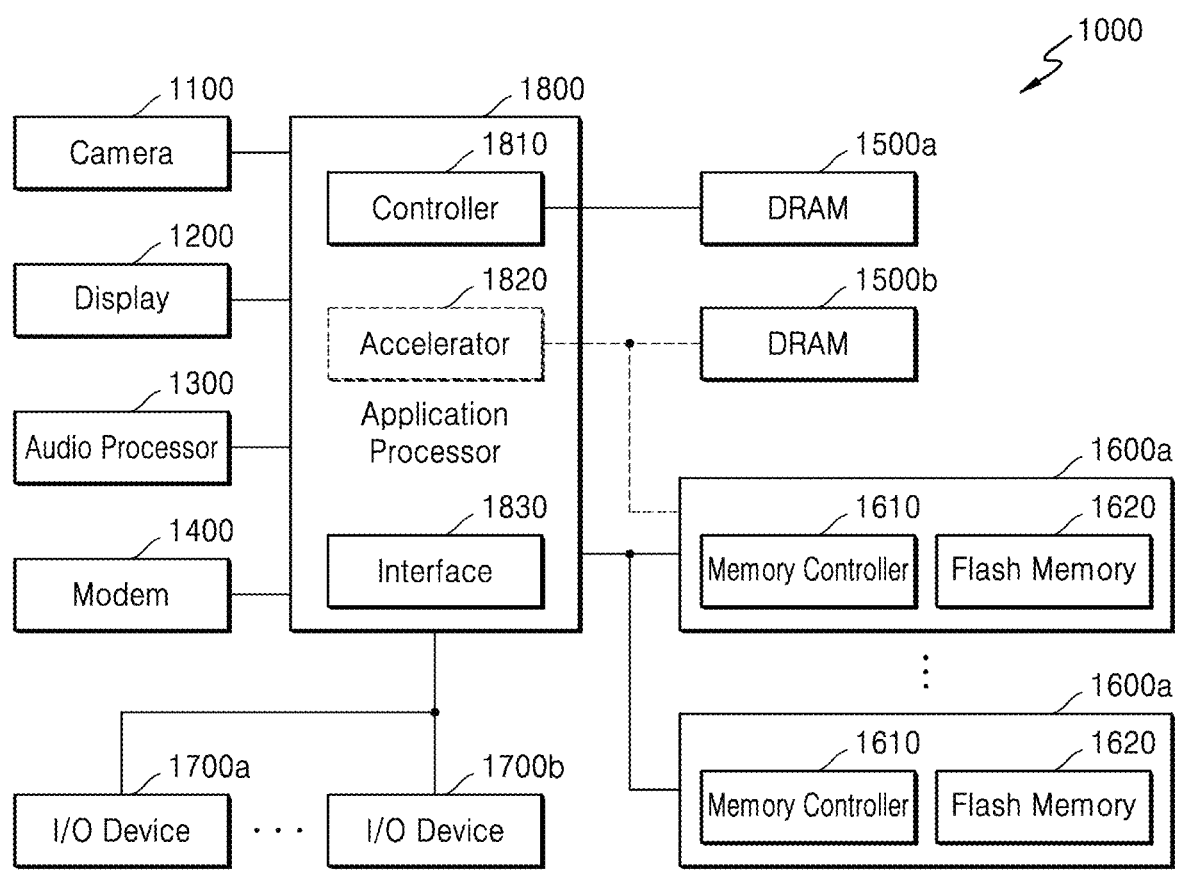
FIG. 7 is a block diagram of a system to which a training method according to some example embodiments is applied.

FIG. 7 is a block diagram of a system 1000 to which a training method according to some example embodiments is applied.

Referring to FIG. 7, the system 1000 may include a camera 1100, a display 1200, an audio processor 1300, a modem 1400, DRAMs 1500a and 1500b, flash memory devices 1600a and 1600b, I/O devices 1700a and 1700b, and an AP 1800. The system 1000 may be implemented by a laptop computer, a mobile terminal, a smartphone, a tablet PC, a wearable device, a health care device, or an IoT device. Also, the system 1000 may be implemented by a server or a PC.

The camera 1100 may capture a still image or a video, store captured image/video data, or transmit the captured image/video data to the display 1200, according to control by a user. The audio processor 1300 may process audio data included in the contents of the flash memory devices 1600a and 1600b or networks. The modem 1400 may modulate and transmit a signal for transmission and reception of wired/wireless data, and a receiving end may demodulate the signal to restore the original signal. The I/O devices 1700a and 1700b may include devices for providing a digital input and/or output function, such as a universal serial bus (USB), a storage, a digital camera, a secure digital (SD) card, a digital versatile disc (DVD), a network adapter, a touch screen, etc.

The AP 1800 may control general operations of the system 1000. The AP 1800 may control the display 1200 to display a portion of the contents stored in the flash memory devices 1600a and 1600b. The AP 1800 may perform a control operation corresponding to a user's input when the AP 1800 receives the user's input through the I/O devices 1700a and 1700b. The AP 1800 may include an accelerator block, which is an exclusive circuit for artificial intelligence (AI) data calculation, or an accelerator 1820 may be separately provided from the AP 1800. A DRAM 1500b may be additionally mounted to the accelerator block or the accelerator 1820. The accelerator may be a functional block specialized in a specific function of the AP 1800 and may include a GPU, which is a functional block specialized in graphics data processing, a neural processing unit (NPU), which is a block specialized in AI calculations and inference, and a data processing unit (DPU), which is a block specialized in data transmission.

The system 1000 may include the plurality of DRAMs 1500a and 1500b. The AP 1800 may control the DRAMs 1500a and 1500b according to a command and an MRS complying with the JEDEC standards or may perform communication by setting a DRAM interface regulation to use a business-exclusive function related to low voltage/high speed/reliability and a cyclic redundancy check (CRC)/error correction code (ECC) function. For example, the AP 1800 may communicate with the DRAM 1500a through an interface conforming to the JEDEC standard such as LPDDR4 and LPDDR5, and the accelerator block or accelerator 1820 may perform communication by setting a new DRAM interface protocol to control the DRAM 1550b for accelerator having a higher bandwidth than that of the DRAM 1500a.

Although only the DRAMs 1500a and 1500b are illustrated in FIG. 7, the example embodiments are not limited thereto. Any memory, such as phase-change RAM (PRAM), SRAM, magnetic RAM (MRAM), resistive RAM (RRAM), ferroelectric RAM (FRAM), or hybrid RAM, may be used if the bandwidth, reaction rate, and voltage requirements for the AP 1800 or the accelerator 1820 are satisfied. The DRAMs 1500a and 1500b may have a relatively less latency and a relatively less bandwidth than the I/O devices 1700a and 1700b or the flash memory devices 1600a and 1600b. The DRAMs 1500a and 1500b may be initialized at a time when the system 1000 is powered on, loaded with an operating system and application data, and may be used as temporary storage locations for the operating system and application data or as execution spaces for various software codes.

In the DRAMs 1500a and 1500b, the four fundamental arithmetic operations of addition/subtraction/multiplication/di-vision, a vector operation, an address operation, or a fast Fourier transform (FET) operation may be performed. Also, a function for performing an inference may be performed in the DRAMs 1500a and 1500b. Here, the inference may be performed in a deep learning algorithm using an artificial neural network. The deep learning algorithm may include a training operation of training a model through various data and an inference operation of recognizing data with the trained model. According to some example embodiments, an image captured by a user by using the camera 1100 may be signal processed and stored in the DRAM 1500b, and the accelerator block or the accelerator 1820 may perform AI data calculation for recognizing data by using data stored in the DRAM 1500b and the function for inference.

The system 1000 may set an improved (or alternatively, optimized) ASV to a lower voltage by a re-training operation, and thus, power consumed in a memory system may be reduced. In addition, the system 1000 may search for an improved (or alternatively, optimized) low voltage by performing training two or more times, and thus, the performance of the memory system may be improved.

The camera 1100, the display 1200, the audio processor 1300, the modem 1400, the DRAMs 1500a and 1500b, the flash memory devices 1600a and 1600b, the I/O devices 1700a and 1700b, and/or the AP 1800 in the system 1000 may partially or fully combine the example embodiments described with reference to FIGS. 1 to 6.

Any of the elements and/or functional blocks disclosed above may include or be implemented in processing circuitry such as hardware including logic circuits; a hardware/software combination such as a processor executing software; or a combination thereof. For example, the memory controller 110, controller 1810, memory controller 1610, and accelerator 1820 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While the inventive concepts have been particularly shown and described with reference to some example embodiments thereof, it will be understood that various changes in form and details may be made therein without departing from the spirit and scope of the following claims.

What is claimed is:

1. An operating method of a memory system configured to search for a data input/output voltage, the operating method comprising:
    searching, by the memory system, for a first driving voltage lower than a first reference voltage by performing first training based on a booting voltage;
    searching, by the memory system, for a second driving voltage lower than a second reference voltage by performing second training based on the first driving voltage; and
    setting, by the memory system, the data input/output voltage lower than the first driving voltage, based on the second driving voltage.

2. The operating method of claim 1, wherein a value of the second driving voltage is less than a value of the first driving voltage.

3. The operating method of claim 1, wherein a value of the first reference voltage is less than a value of the second reference voltage.

4. The operating method of claim 1, wherein a value of the data input/output voltage is less than a value of the booting voltage.

5. The operating method of claim 1, wherein a value of the data input/output voltage is greater than a value of the second driving voltage.

6. The operating method of claim 1, further comprising, after searching for the first driving voltage, setting a set voltage based on a value of a first guard band voltage and a value of the first driving voltage,
wherein the searching for the second driving voltage comprises performing the second training with the set voltage.

7. The operating method of claim 6, wherein a value of the set voltage is greater than a value of the data input/output voltage.

8. The operating method of claim 6, wherein the setting of the data input/output voltage comprises:
setting a value of the data input/output voltage based on a value of the second driving voltage and a value of a second guard band voltage.

9. The operating method of claim 8, wherein the value of the first guard band voltage and the value of the second guard band voltage are different from each other.

10. A memory controller configured to control a memory device, comprising:
a first training circuit configured to transmit a first training command to the memory device through a plurality of signal pins, and receive a first driving voltage from the memory device;
a first voltage comparison circuit configured to output the first driving voltage by comparing the first driving voltage with a first reference voltage;
a set voltage generating circuit configured to generate a set voltage based on a value of a first guard band voltage and a value of the first driving voltage;
a second training circuit configured to transmit a second training command to the memory device through the plurality of signal pins, and receive a second driving voltage from the memory device;
a second voltage comparison circuit configured to output the second driving voltage by comparing the second driving voltage with a second reference voltage; and
a data input/output voltage generating circuit configured to generate a data input/output voltage based on a value of a second guard band voltage and a value of the second driving voltage.

11. The memory controller of claim 10, wherein the value of the second driving voltage is less than the value of the first driving voltage.

12. The memory controller of claim 10, wherein a value of the first reference voltage is less than a value of the second reference voltage.

13. The memory controller of claim 10, wherein a value of the data input/output voltage is greater than the value of the second driving voltage.

14. The memory controller of claim 10, wherein the value of the first guard band voltage is different from the value of the second guard band voltage.

15. The memory controller of claim 10, wherein the value of the first guard band voltage is equal to the value of the second guard band voltage.

16. A memory system comprising:
a memory device; and
a memory controller configured to output a data input/output voltage to be provided to the memory device,
wherein the memory controller comprises
a training circuit configured to perform training on the memory device at least twice by receiving a booting voltage,
a voltage comparison circuit configured to respectively compare driving voltages searched by the memory device with reference voltages, and
a data input/output voltage generating circuit configured to generate the data input/output voltage based on a first voltage, the first voltage being based on a comparison result of the voltage comparison circuit, and
wherein the memory device comprises a mode register set (MRS) configured to store a result value of performing the training.

17. The memory system of claim 16, wherein a value of the data input/output voltage is less than a value of the booting voltage.

18. The memory system of claim 16, wherein a value of each of the driving voltages is less than a value of the data input/output voltage.

19. The memory system of claim 16, wherein the memory controller further comprises a set voltage generating circuit configured to generate a set voltage based on a value of a guard band voltage and a value output by the voltage comparison circuit.

20. The memory system of claim 19, wherein the value of the guard band voltage is less than a value of each of the driving voltages.

* * * * *